US012559842B2

(12) United States Patent
Gu et al.

(10) Patent No.: US 12,559,842 B2
(45) Date of Patent: Feb. 24, 2026

(54) MPCVD DEVICE CAPABLE OF REALIZING EFFECTIVE DOPING

(71) Applicant: Nanjing University, Nanjing (CN)

(72) Inventors: Shulin Gu, Nanjing (CN); Songmin Liu, Nanjing (CN); Shunming Zhu, Nanjing (CN); Jiandong Ye, Nanjing (CN); Kun Tang, Nanjing (CN); Zili Xie, Nanjing (CN); Rong Zhang, Nanjing (CN); Youdou Zheng, Nanjing (CN)

(73) Assignee: Nanjing University, Nanjing (CN)

( * ) Notice: Subject to any disclaimer, the term of this patent is extended or adjusted under 35 U.S.C. 154(b) by 411 days.

(21) Appl. No.: 18/116,270

(22) Filed: Mar. 1, 2023

(65) Prior Publication Data

US 2023/0279549 A1 Sep. 7, 2023

(30) Foreign Application Priority Data

Mar. 2, 2022 (CN) .......................... 202210197268.3

(51) Int. Cl.
*C23C 16/455* (2006.01)
*C23C 16/27* (2006.01)
(Continued)

(52) U.S. Cl.
CPC ........ *C23C 16/4558* (2013.01); *C23C 16/278* (2013.01); *C23C 16/45561* (2013.01); *C23C 16/4586* (2013.01); *C23C 16/511* (2013.01)

(58) Field of Classification Search
CPC . C23C 16/274; C23C 16/4586; C23C 16/511; C23C 16/45508; C23C 16/4558
See application file for complete search history.

(56) References Cited

U.S. PATENT DOCUMENTS 5,449,880 A 9/1995 Takaki
2001/0049203 A1* 12/2001 Kim ................... C23C 16/4558
438/778
(Continued)

FOREIGN PATENT DOCUMENTS

CN 102575341 A 7/2012
CN 103590015 A 2/2014
(Continued)

OTHER PUBLICATIONS

Kim Jusung KR10200010045284 Eng and Korean Jun. 2004 (Year: 2004).*

*Primary Examiner* — Joseph A Miller, Jr.
(74) *Attorney, Agent, or Firm* — Tarter Krinsky & Drogin LLP

(57) ABSTRACT

An MPCVD device capable of realizing effective doping comprises a reaction chamber and a gas input structure, wherein the gas input structure includes a first pipeline and a second pipeline for reaction gas, a first gas distributor connected with the first pipeline that uniformly transports gas as a first reactant into the reaction chamber through a gas outlet of the first pipeline located near the top of the reaction chamber, wherein the second pipeline uniformly inputs a doped reaction gas to a surface of a substrate through a second gas distributor in the form of a gas transport ring having a circular shape, wherein a height in the vertical direction of the gas transport ring connected with the second pipeline is substantially the same as that of a support for the substrate. The gas transport ring can be concentrically placed at a center position inside the support, or concentrically placed outside the support.

5 Claims, 3 Drawing Sheets

(51) Int. Cl.
    *C23C 16/458*        (2006.01)
    *C23C 16/511*        (2006.01)

(56)             References Cited

U.S. PATENT DOCUMENTS

| 2014/0234556 | A1* | 8/2014 | Dodge | C30B 29/04 |
| | | | | 427/575 |
| 2015/0132929 | A1 | 5/2015 | Horigome et al. | |
| 2020/0123653 | A1 | 4/2020 | Scholz | |

FOREIGN PATENT DOCUMENTS

| CN | 103628048 | A | 3/2014 |
| CN | 105925953 | A | 9/2016 |
| CN | 108103571 | A | 6/2018 |
| CN | 111519248 | A | 8/2020 |
| CN | 213951415 | U | 8/2021 |
| JP | H11271553 | A | 10/1999 |
| JP | 2005298293 | A | 10/2005 |
| JP | 2019169743 | A | 10/2019 |
| KR | 1020010045284 | * | 6/2004 |
| WO | 2013121538 | A1 | 8/2013 |

* cited by examiner

MPCVD DEVICE CAPABLE OF REALIZING EFFECTIVE DOPING

CROSS-REFERENCE TO RELATED APPLICATION

This application claims priority to Chinese Patent Application No. 202210197268.3, filed on Mar. 2, 2022, which is hereby incorporated by reference in its entirety.

TECHNICAL FIELD

The present application relates to the field of microwave plasma chemical vapor deposition, in particular to a gas input structure of a device.

BACKGROUND

Microwave plasma chemical vapor deposition technology (MPCVD) is one of the mainstream technologies of diamond film epitaxy, and is the best choice for preparing high-quality diamond films. The microwave resonant chamber and plasma sphere in MPCVD reaction chamber are the core of its design and attention. After years of research and development, a high-quality diamond single crystal film can be grown by using MPCVD technology.

In order to broaden the application field of diamond and give full play to its physical and chemical properties, it is necessary to carry out the doping research on diamond film. However, currently, there is still a big gap between the diamond doping research carried out based on MPCVD technology and the single crystal growth technology, which, in addition to being closely related to the inherent physical properties of diamond itself and the behaviors of impurities, is also closely related to the limitations of current diamond MPCVD commercial device. For the growth of diamond single crystal film, the MPCVD uses a single reagent—methane, without the need for complex chemical reaction control, and researchers generally believe that the microwave plasma from which the reaction group is resulted is the most critical parameter and the most important condition that affects the material growth, and thus, people pay less attention to the research of gas transport in MPCVD.

However, the problem of material doping research is much more complex, wherein, some studies show that the main reaction group of diamond film growth is the single carbon and double carbon groups produced by the decomposition reaction of methane molecules caused by the reaction of hydrogen atoms generated by high temperature plasma and methane molecules in the reaction gas, while commonly used dopants in the diamond film doping, such as borane and phosphine, usually has a lower decomposition temperature. If the traditional device design concept is adopted, it will lead to excessive decomposition of the dopant in the high temperature plasma region and low utilization efficiency; in addition, this excessive decomposition will lead to a large number of deposition of doped atoms on the surrounding relatively low temperature reaction chamber wall, causing very serious impurity memory effect and contamination in the MPCVD reaction chamber, which seriously restricts the exploration research and application implementation of the in-situ doping technology of MPCVD. Based on the huge different behavior characteristics of the reactant and dopant in this material growth, it is necessary to give different energy requirements for different dopants.

How to effectively carry out in situ doping of diamond film and realize high efficiency and low cost material growth is an urgent problem to be solved in the industry.

SUMMARY

The purpose of the present application is to propose an MPCVD device capable of realizing effective doping in view of the existing technical problems, wherein gas as a first reactant and a doped reaction gas as a second reactant are transported, respectively, to different regions in the reaction chamber to realize the control of different energy of different gas groups, focusing on solving the design and optimization of the second line of gas flow introduction structure that is fully compatible with the microwave coupling resonant chamber, wherein the second line of gas flow is uniformly introduced to a surface of a substrate without directly flowing out before flowing to the surface for deposition (i.e., a direct short-circuit outflow), and its influence on the microwave plasma sphere is controlled, which effectively realize the in-situ doping of diamond film, and suppress or overcome the doping contamination and memory effect of MPCVD reaction chamber. A section structure schematic view of the device is shown in FIG. 1.

The technical solution of the present application is an MPCVD device capable of realizing effective doping, which comprises a reaction chamber and a gas input structure, wherein the gas input structure includes a first pipeline and a second pipeline for reaction gases, a first gas distributor, which is located at a top of the reaction chamber and connected with the first pipeline, uniformly transports gas as a first reactant into the reaction chamber through a gas outlet of the first pipeline located near the top of the reaction chamber, the second pipeline uniformly inputs a doped reaction gas as a second reactant to a surface of a substrate through a second gas distributor with circular shape (hereinafter referred to as a gas transport ring), a height in the vertical direction of the gas transport ring connected with the second pipeline is substantially the same as that of a support for the substrate, and the gas transport ring can be concentrically placed at a center position inside the support, or the gas transport ring can be also concentrically placed outside the support.

The height difference between the gas transport ring and the support is controlled within 0.5 cm, such that the doped reaction gas is transported and is introduced uniformly to the surface of the substrate, preventing it from occurring a direct short-circuit outflow. A gas outlet of the second pipeline is connected with the gas transport ring to input the doped reaction gas into the reaction chamber, and the gas transport ring can be made of stainless steel or metal molybdenum, or quartz or corundum suitable for microwave environment.

The gas transport ring can be placed in a center of the support, and the doped reaction gas can radiate from the center of the support to the surrounding, as shown in FIG. 2;

The gas transport ring can be placed around the support, and wherein: the gas transport ring can be placed in close contact with the support, as shown in FIG. 4; or the gas transport can also be placed at a certain distance from a circumferential edge of the support, as shown in FIG. 3;

The gas transport ring is provided with 8 to 72 jet holes, in order to obtain a uniform distribution of reactants on the substrate to be filmed.

It should be noted that, the height difference between the gas transport ring and the support is configured to be between 0.5 cm and −0.5 cm, in order to facilitate controlling the spatial relationship between the jet gas and the plasma sphere, realizing a more uniform distribution of the doped reaction gas on the surface of the substrate, and at the same time, realizing the control of the appropriate energy of the dopant group.

A diameter of the jet hole is configured to be less than or equal to 0.1 cm, in order to facilitate realizing jet transportation of the gas. Thus, the doped reaction gas is transported to the surface of the substrate in a way of avoiding a gas divergence caused by an oversized hole diameter.

A jet angle of the jet hole of the gas transport ring is within a range of −15 degrees to 15 degrees, wherein the jet angle is an included angle between a gas outlet of the jet hole and a horizontal plane, in order to facilitate controlling the spatial relationship between the jet gas and the plasma sphere, realizing a more uniform distribution of the doped reaction gas on the surface of the substrate, and at the same time, realizing the control of the appropriate energy of the dopant group. As shown in FIGS. 5 (a) and 6 (a).

Furthermore, the jet holes on the gas transport ring are uniformly distributed along a circumference of the gas transport ring and are spaced with each other at an angle ranging from 45 degrees to 5 degrees, so as to realize a more uniform distribution of the doped reaction gas on the surface of the substrate, as shown in FIGS. 5 (b) and 6 (b).

The beneficial effect of the present application: the gas input structure design proposed by the present application transports, respectively, gas as a first reactant and a doped reaction gas as a second reactant to different regions in the reaction chamber, which can realize the control of different energy of different gas groups, effectively realize the in-situ doping of diamond film, improve the utilization rate of raw materials, and suppress or overcome the doping contamination and memory effect in the MPCVD reaction chamber, which plays a positive role for revealing and solving the problem of diamond doping, the doping mechanism and difficulties.

The MPCVD device in the present application focuses on solving the design and optimization of the second line of gas flow introduction structure that is fully compatible with the microwave coupling resonant chamber, wherein gas as a first reactant and a doped reaction gas as a second reactant are transported, respectively, to different regions in the reaction chamber to realize the control of different energy of different gas groups, and the influence of the second line of gas flow on the microwave plasma sphere is controlled. The application of the MPCVD microwave resonant chamber of the present application has significantly improved the quality of the MP product.

BRIEF DESCRIPTION OF DRAWINGS

FIG. 5 (b) is a schematic top view of a gas transport ring being a circular ring located at a center of a support;

FIG. 6 (b) is a schematic top view of a gas transport ring being a circular ring located around a support.

DESCRIPTION OF EMBODIMENTS

In order to enable those skilled in the art to better understand the technical solution of the present application, the present application will be further described in detail in combination with the attached drawings and specific embodiments. It can be appreciated that, the specific embodiments described herein are only used to illustrate and explain the technical solution of the present application and are not intended to limit the present application.

Figure 1:
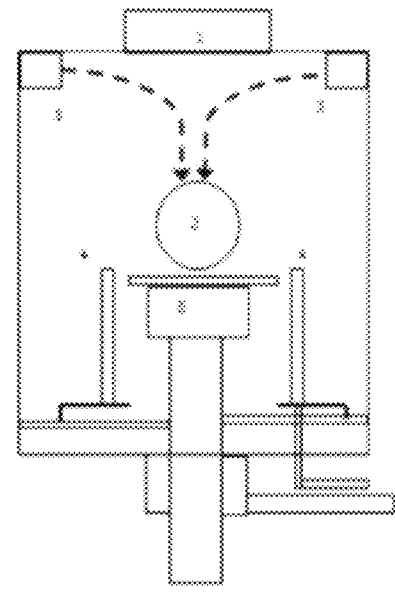
FIG. 1 is a schematic view of MPCVD reaction chamber of the present application.

The MPCVD microwave resonant chamber in the present application adopts a structure similar with the current commercial single-mode cylindrical flat-plate structure, as shown in FIG. 1, a water-cooled chamber wall of the resonant chamber distances a relatively large space interval from a high-temperature plasma sphere, which is helpful to reduce the reaction deposition on the chamber wall of the reaction chamber and the resulting doping memory effect. The present application focuses on solving the design and optimization of the second line of gas flow introduction structure that is fully compatible with the microwave coupling resonant chamber, wherein gas as a first reactant and a doped gas as a second reactant are transported, respectively, to different regions in the reaction chamber to realize the control of different energy of different gas groups, and the influence of the second line of gas flow on the microwave plasma sphere is controlled, which can effectively realize the in-situ doping of diamond film, suppressing or overcoming the doping contamination and memory effect of MPCVD reaction chamber.

Embodiment 1: A Transport Ring 4 Being a Circular-Ring Gas Transport Structure Located at a Center of a Support A hole with a diameter of less than 0.6 cm is opened in the center of a support 5 for a substrate to ensure that its influence on the microwave coupling and the formation of a plasma sphere 2 is reduced to a controllable range, and a suitable structure is processed under the support 5 to introduce a second line of doped reaction gas and buffer gas from outside the reaction chamber to a central gas transport ring. A microwave window 1 is located at the center above the reaction chamber.

Figure 2:
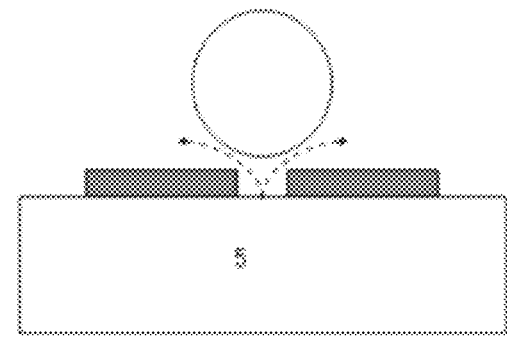
FIG. 2 is a structure schematic view of a gas transport ring located at a center of a support.

The central gas transport ring adopts a circular-ring structure of radiating from the center of the support to the surrounding, and can be made of quartz or corundum, or metal such as stainless steel or molybdenum, as shown in FIG. 2.

A height difference between a jet hole on the above gas transport ring and the support is configured to be between 0.5 cm and −0.5 cm, in order to facilitate controlling the spatial relationship between the jet gas and the plasma sphere, realizing a more uniform distribution of the doped reaction gas on a surface of the substrate, and at the same time, realizing the control of the appropriate energy of the dopant group, and ensuring that the growth gas flow can leave the support and be extracted smoothly.

Figure 5A:
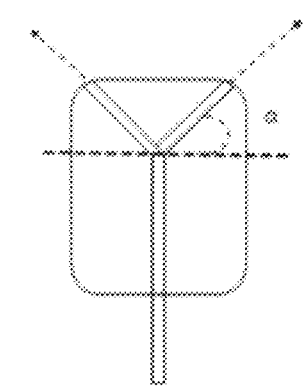
FIG. 5 (a) is a schematic section view of a gas transport ring being a circular ring located at a center of a support.
Figure 5B:
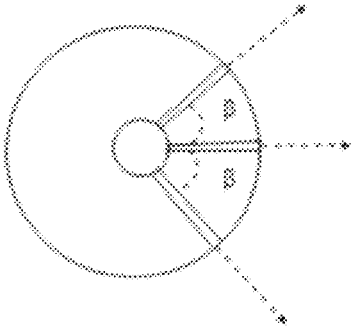

The size of a jet angle α of the jet hole on the above gas transport ring can be between 15 degrees and −15 degrees, so as to control the spatial relationship between the jet gas and the plasma sphere, realize a more uniform distribution of the doped reaction gas on the surface of the substrate, and at the same time, realize the control of the appropriate energy of the dopant group, as shown in FIG. 5.

Figure 6A:
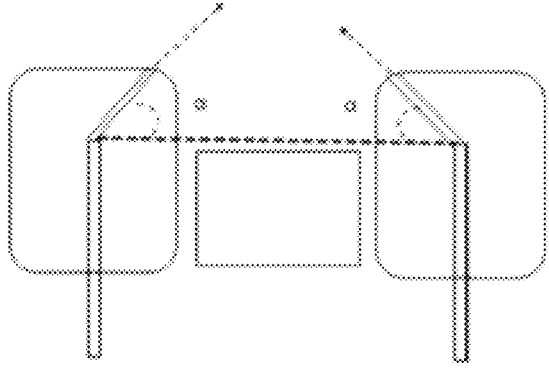
FIG. 6 (a) is a schematic section view of a gas transport ring being a circular ring located around a support.
Figure 6B:
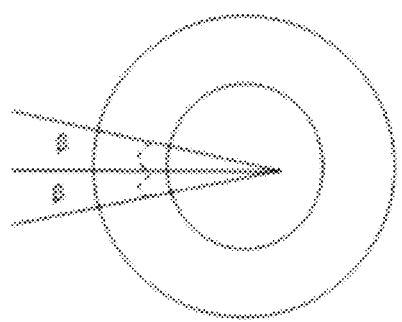

The jet holes on the above gas transport ring are uniformly distributed along a circumference of the gas transport ring and are spaced with each other at an angle $\ominus$ ranging from 45 degrees to 5 degrees, so as to realize a more uniform distribution of doped reaction gas on the surface of the substrate, as shown in FIG. 6.

Since an oversized hole diameter will lead to a gas divergence, a diameter of the jet hole on the gas transport ring is configured to be ≤0.1 cm, in order to facilitate realizing jet transportation of the gas, thus transporting the doped reaction gas to the surface of the substrate.

The main reaction gases in MPCVD are mainly hydrogen and methane, wherein the flow rate of hydrogen is generally controlled between hundreds of sccm and thousands of sccm, while the flow rate of methane is generally controlled between several sccm and tens of sccm, ensuring that the concentration of methane in the growth chamber is controlled between 1% and 10%.

The main reaction gases, i.e., gases as a first reactant in MPCVD are projected into the surface of the substrate by a circular ring distributor, i.e., a first gas distributor 3 above the reaction chamber, passing through a high temperature region of the microwave plasma sphere, and through collisions of high temperature electrons, hydrogen is decomposed into high-energy hydrogen atoms, which react with methane molecules to form single-carbon and double-carbon reaction groups required for film growth.

The doped reaction gas in MPCVD is mainly borane and phosphine, which is generally diluted in high-purity hydrogen, wherein the dilution concentration ranges from ppm to thousands of ppm, and the flow rate generally ranges from several sccm to tens of sccm.

The doped reaction gas in MPCVD needs to be equipped with a buffer gas with appropriate flow rate, and the flow rate of the buffer gas is generally configured to be ranged from several sccm to tens of sccm.

The total flow of the second line of doped reaction gas and buffer gas in MPCVD is controlled at tens of sccm, so as to realize the jetting of doped reaction gas and the uniform distribution of doped groups on the surface of the substrate, and at the same time, the influence of the gas flow on the formation and stability of the microwave plasma sphere is controlled to realize a stable growth of the doping.

According to this embodiment of the present application, the rate of growing boron-doped diamond using double-gas lines device reaches about 10 um/h, which is more than twice as high as that of single-gas line device, the doping concentration of the grown film is more than 2 orders of magnitude higher than that of single-gas line device, and the quality and uniformity of the film are also significantly improved.

Embodiment 2: A Gas Transport Ring 4 Being a Structure Located Around a Support and Keeping a Certain Distance From the Support A circular ring, i.e., a surrounding gas transport ring with a diameter of more than 6 cm is fixed around a support for a substrate, keeps a suitable spaced distance from a circumferential edge of the support to ensure that its influence on the microwave coupling and the formation of a plasma sphere is reduced to a controllable range, and is coupled with a suitable exhaust structure to ensure a normal and effective discharge of a reaction waste gas.

A suitable support and gas connection structure is processed under the support or surrounding gas transport ring, to introduce a second line of doped reaction gas and buffer gas from outside the reaction chamber to the surrounding gas transport ring.

Figure 3:
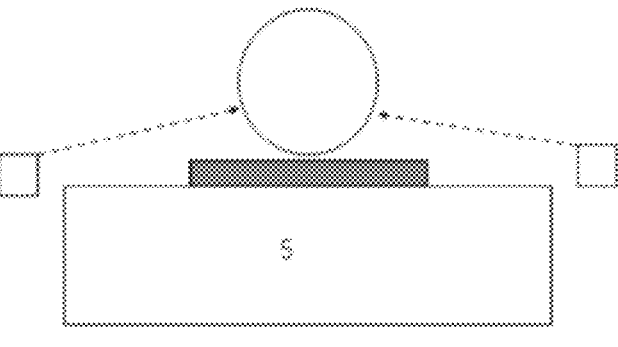
FIG. 3 is a structure schematic view of a gas transport ring located around a support and keeping a certain distance from the support.

The surrounding gas transport ring adopts a circular-ring structure of radiating from the surrounding to a center of the support, and can be made of quartz or corundum, or metal such as stainless steel or molybdenum, as shown in FIG. 3.

A height difference between a jet hole on the above gas transport ring and the support is configured to be between 0.5 cm and −0.5 cm, in order to facilitate controlling the spatial relationship between the jet gas and the plasma sphere, realizing a more uniform distribution of the doped reaction gas on a surface of the substrate, and at the same time, realizing the control of the appropriate energy of the dopant group, and ensuring that the growth gas flow can leave the support and be extracted smoothly.

The size of a jet angle $\alpha$ of the jet hole on the above gas transport ring can be between 15 degrees and −15 degrees, so as to control the spatial relationship between the jet gas and the plasma sphere, realize a more uniform distribution of the doped reaction gas on the surface of the substrate, and at the same time, realize the control of the appropriate energy of the dopant group, as shown in FIG. 6.

The jet holes on the above gas transport ring are uniformly distributed along a circumference of the gas transport ring and are spaced with each other at an angle $\beta$ ranging from 45 degrees to 5 degrees, so as to realize a more uniform distribution of doped reaction gas on the surface of the substrate, as shown in FIG. 6.

Since an oversized hole diameter will lead to a gas divergence, a diameter of the jet hole on the gas transport ring is configured to be ≤0.1 cm, in order to facilitate realizing jet transportation of the gas, thus transporting the doped reaction gas to the surface of the substrate.

The main reaction gases in MPCVD are mainly hydrogen and methane, wherein the flow rate of hydrogen is generally controlled between hundreds of sccm and thousands of sccm, while the flow rate of methane is generally controlled between several sccm and tens of sccm, ensuring that the concentration of methane in the growth chamber is controlled between 1% and 10%.

The main reaction gases, i.e., gases as a first reactant in MPCVD are projected into the surface of the substrate by a circular ring distributor, i.e., a first gas distributor 3 above the reaction chamber, passing through a high temperature region of the microwave plasma sphere, and through collisions of high temperature electrons, hydrogen is decomposed into high-energy hydrogen atoms, which react with methane molecules to form single-carbon and double-carbon reaction groups required for film growth.

The doped reaction gas in MPCVD is mainly borane and phosphine, which is generally diluted in high-purity hydrogen, wherein the dilution concentration ranges from ppm to thousands of ppm, and the flow rate generally ranges from several sccm to tens of sccm.

The doped reaction gas in MPCVD needs to be equipped with a buffer gas with appropriate flow rate, and the flow rate of the buffer gas is generally configured to be ranged from several sccm to tens of sccm.

The total flow of the second line of doped reaction gas and buffer gas in MPCVD is controlled at tens of sccm, so as to realize the jetting of doped reaction gas and the uniform distribution of doped groups on the surface of the substrate, and at the same time, the influence of the gas flow on the formation and stability of the microwave plasma sphere is controlled to realize a stable growth of the doping.

According to this embodiment of the present application, the rate of growing boron-doped diamond using double-gas lines device reaches about 10 um/h, which is more than twice as high as that of single-gas line device, the doping concentration of the grown film is more than 2 orders of magnitude higher than that of single-gas line device, and the quality and uniformity of the film are also significantly improved.

Figure 4:
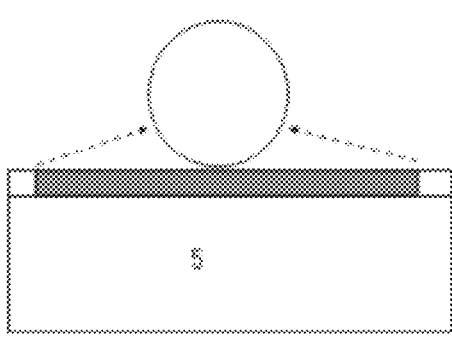
FIG. 4 is a structure schematic view of a gas transport ring located around a support and in close contact with the support.

Embodiment 3: A Gas Transport Ring 4 Being a Structure Located Around a Support and in Close Contact With the Support A circular ring, i.e., a surrounding gas transport ring is fixed around a support for a substrate, keeping close contact with a circumferential edge of the support to ensure that its influence on microwave coupling and the formation of a plasma sphere is reduced to a controllable range, and a suitable support and gas connection structure is processed under the support or surrounding gas transport ring, to introduce a second line of doped reaction gas and buffer gas from outside the reaction chamber to the surrounding gas transport ring, as shown in FIG. 4.

The surrounding gas transport ring adopts a circular-ring structure of radiating from the surrounding to a center of the support, and can be made of quartz or corundum, or metal such as stainless steel or molybdenum.

A height difference between a jet hole on the above gas transport ring and the support is configured to be between 0.5 cm and –0.5 cm, in order to facilitate controlling the spatial relationship between the jet gas and the plasma sphere, realizing a more uniform distribution of the doped reaction gas on the surface of the substrate, and at the same time, realizing the control of the appropriate energy of the dopant group, and ensuring that the growth gas flow can leave the support and be extracted smoothly.

The size of a jet angle α of the jet hole on the above gas transport ring can be between 15 degrees and –15 degrees, so as to control the spatial relationship between the jet gas and the plasma sphere, realize a more uniform distribution of the doped reaction gas on the surface of the substrate, and at the same time, realize the control of the appropriate energy of the dopant group, as shown in FIG. 6.

For the distribution of the jet holes on the above gas transport ring, they are uniformly distributed along a circumference of the gas transport ring and are spaced with each other at an angle β ranging from 45 degrees to 5 degrees, so as to realize a more uniform distribution of doped reaction gas on the surface of the substrate, as shown in FIG. 6.

Since an oversized hole diameter will lead to a gas divergence, a diameter of the jet hole on the gas transport ring is configured to be ≤0.1 cm, in order to facilitate realizing jet transportation of the gas, thus transporting the doped reaction gas to the surface of the substrate.

The main reaction gases in MPCVD are mainly hydrogen and methane, wherein the flow rate of hydrogen is generally controlled between hundreds of sccm and thousands of sccm, while the flow rate of methane is generally controlled between several sccm and tens of sccm, ensuring that the concentration of methane in the growth chamber is controlled between 1% and 10%.

The main reaction gases, i.e., gases as a first reactant in MPCVD are projected into the surface of the substrate by a circular ring distributor, i.e., a first gas distributor 3 above the reaction chamber, passing through a high temperature region of the microwave plasma sphere, and through collisions of high temperature electrons, hydrogen is decomposed into high-energy hydrogen atoms, which react with methane molecules to form single-carbon and double-carbon reaction groups required for film growth.

The doped reaction gas in MPCVD is mainly borane and phosphine, which is generally diluted in high-purity hydrogen, wherein the dilution concentration ranges from ppm to thousands of ppm, and the flow rate generally ranges from several sccm to tens of sccm.

The doped reaction gas in MPCVD needs to be equipped with a buffer gas with appropriate flow rate, and the flow rate of the buffer gas is generally configured to be ranged from several sccm to tens of sccm.

The total flow of the second line of doped reaction gas and buffer gas in MPCVD is controlled at tens of sccm, so as to realize the jetting of doped reaction gas and the uniform distribution of doped groups on the surface of the substrate, and at the same time, the influence of the gas flow on the formation and stability of the microwave plasma sphere is controlled to realize a stable growth of the doping.

According to this embodiment of the present application, the rate of growing boron-doped diamond using double-gas lines device reaches about 10 um/h, which is more than twice as high as that of single-gas line device, the doping concentration of the grown film is more than 2 orders of magnitude higher than that of single-gas line device, and the quality and uniformity of the film are also significantly improved.

For those skilled in the art, various corresponding changes and variations can be made according to the technical solution and concept described in the present application, and all these changes and variations fall within the protection scope of the claims of the present application.

What is claimed is:

1. An microwave plasma chemical vapor deposition (MPCVD) device capable of realizing effective doping, characterized in that, the device comprises a reaction chamber and a gas input structure, wherein the gas input structure includes:

a first pipeline and a second pipeline for reaction gases;

a first gas distributor located at a top of the reaction chamber and connected with the first pipeline, that uniformly transports gas as a first reactant into the reaction chamber through a gas outlet of the first pipeline located near the top of the reaction chamber;

a second gas distributor in the form of a gas transport ring having a circular shape, wherein the second pipeline uniformly inputs a doped reaction gas as a second reactant to a surface of a substrate through the gas transport ring, wherein a height difference in the vertical direction between the gas transport ring connected with the second pipeline and a support for the substrate is controlled within 0.5 cm, such that the doped reaction gas is transported and introduced uniformly to the surface of the substrate, and wherein the gas transport ring is concentrically placed at a center position inside the support, or concentrically placed outside the support;

wherein the gas transport ring includes 8 to 72 jet holes, such that a uniform distribution of reactants on the substrate to be filmed can be obtained, wherein jet angles of the jet holes are within a range of –15 degrees to 15 degrees, wherein the jet angle is an included angle between a gas outlet of the jet hole and a horizontal plane.

2. The device according to claim 1, characterized in that a gas outlet of the second pipeline is connected with the gas transport ring to input the doped reaction gas into the reaction chamber, and the gas transport ring is made of stainless steel, metal molybdenum, quartz or corundum.

3. The device according to claim 1, characterized in that the gas transport ring is placed:

(a) in a center of the support, such that the doped reaction gas can radiate from the center of the support to the surrounding area; or (b) around the support, such that the gas transport ring is in close contact with the support; or (c) at a certain distance from a circumferential edge of the support.

4. The device according to claim 1, characterized in that diameters of the jet holes are less than or equal to 0.1 cm, such that realizing jet transportation of the gas can be facilitated.

5. The device according to claim 1, characterized in that the jet holes on the gas transport ring are uniformly distributed along a circumference of the gas transport ring and are spaced with each other at an angle $\beta$ ranging from 45 degrees to 5 degrees, such that a more uniform distribution of the doped reaction gas can be realized on the surface of the substrate.

\* \* \* \* \*